United States Patent
Lee et al.

(10) Patent No.: US 8,828,763 B1
(45) Date of Patent: Sep. 9, 2014

(54) MANUFACTURING DEVICE OF ORGANIC LIGHT EMITTING DIODE DISPLAY AND METHOD FOR MANUFACTURING ORGANIC LIGHT EMITTING DIODE DISPLAY USING THE SAME

(71) Applicant: Samsung Display Co., Ltd., Yongin (KR)

(72) Inventors: Dong Hoon Lee, Asan-si (KR); Jun Ha Park, Anyang-si (KR); Kazuhiro Haraguchi, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/023,719

(22) Filed: Sep. 11, 2013

(30) Foreign Application Priority Data

May 15, 2013 (KR) .................. 10-2013-0055091

(51) Int. Cl.
*H01L 21/00* (2006.01)
*H01L 51/56* (2006.01)
*H01L 51/00* (2006.01)

(52) U.S. Cl.
CPC ............ *H01L 51/0005* (2013.01); *H01L 51/56* (2013.01)
USPC .......................................... 438/34; 438/780

(58) Field of Classification Search
USPC ...................... 438/30, 780–781, 34
See application file for complete search history.

(56) References Cited

U.S. PATENT DOCUMENTS

| | | | |
|---|---|---|---|
| 6,692,610 B2 * | 2/2004 | Low et al. .................. | 156/273.5 |
| 7,084,425 B2 * | 8/2006 | Kondakova et al. ............ | 257/40 |
| 2012/0217490 A1 * | 8/2012 | Towns et al. .................... | 257/40 |

FOREIGN PATENT DOCUMENTS

| | | |
|---|---|---|
| JP | 2003-001171 A | 1/2003 |
| KR | 1020030093045 A | 12/2003 |
| KR | 1020050096473 A | 10/2005 |
| KR | 1020070066913 A | 6/2007 |
| KR | 1020090130245 A | 12/2009 |
| KR | 1020110082644 A | 7/2011 |
| KR | 1020110136619 A | 12/2011 |

* cited by examiner

*Primary Examiner* — Richard Booth
(74) *Attorney, Agent, or Firm* — Cantor Colburn LLP

(57) ABSTRACT

A manufacturing device of an organic light emitting diode display, includes a stage including a temperature controller which heats or cools a region of a substrate on the stage; a discharging unit including a nozzle which provides light-emitting material to the region of the substrate; a beam irradiation unit which irradiates beams to the substrate; and a driving unit which is configured to move the stage or the discharging unit.

3 Claims, 14 Drawing Sheets

MANUFACTURING DEVICE OF ORGANIC LIGHT EMITTING DIODE DISPLAY AND METHOD FOR MANUFACTURING ORGANIC LIGHT EMITTING DIODE DISPLAY USING THE SAME

This application claims priority to Korean Patent Application No. 10-2013-0055091 filed on May 15, 2013, and all the benefits accruing therefrom under 35 U.S.C. §119, the disclosure of which is incorporated herein by reference in its entirety.

BACKGROUND

1. Field

The invention relates to a manufacturing device of an organic light emitting diode display and a method for manufacturing the organic light emitting diode display using the manufacturing device. More particularly, the invention relate to a manufacturing device of an organic light emitting diode display, for forming an organic layer on a substrate, and a method for manufacturing the organic light emitting diode display using the manufacturing device.

2. Description of the Related Art

A display that implements a variety of information on a screen is a core technology in the information-oriented communication age and is advancing toward slimness, lightness in weight, portability and high performance. Accordingly, growing attention has been paid to flat panel displays including an organic light emitting diode ("OLED") display, which can overcome the drawbacks of the conventional cathode ray tube ("CRT"), which is heavy-weighted and large-sized.

Here, the OLED display is a self-emissive device using a relatively thin organic light-emitting layer between electrodes, and is advantageous because of a capability of implementing slimness. OLED displays are classified into small molecule OLED displays and polymer OLED displays according to the material of an organic light-emitting layer for generating light. The organic light-emitting layer of the small molecule OLED display is generally formed as a thin film by vacuum deposition, and the organic light-emitting layer of the polymer molecule OLED display is generally formed as a thin film by a solution coating method, such as spin coating or ink jet printing.

SUMMARY

One or more exemplary embodiment of the invention provides a manufacturing device of an organic light emitting diode ("OLED") display including an organic layer having a uniform thickness.

One or more exemplary embodiment of the invention provides a method for manufacturing the OLED display including an organic layer having a uniform thickness.

An exemplary embodiment of a manufacturing device of an OLED display includes a stage including a temperature controller which heats or cools a region of a substrate on the stage; a discharging unit including a nozzle which provides light-emitting material to the region of the substrate; a beam irradiation unit which irradiates beams to the substrate; and a driving unit which is configured to move the stage or the discharging unit.

Another exemplary embodiment of a manufacturing device of an OLED display includes a stage including a temperature controller which heats or cools a region of a substrate on the stage; a discharging unit spaced apart a predetermined distance apart from and facing the stage, the discharging unit including a nozzle, and a beam irradiator adjacent to the nozzle; and a driving unit which is configured to move the stage or the discharging unit.

An exemplary embodiment of a method for manufacturing an OLED display includes providing a substrate including a plurality of regions arranged in a first direction, on a stage; sequentially providing light-emitting material to the plurality of regions of the substrate, in the first direction; heating a first region having the light-emitting material therein, among the plurality of regions, by a temperature controller, at substantially a same time or after the light-emitting material is provided to the first region; and hardening a surface of the light-emitting material in the first region, by irradiating a beam to the light-emitting material in the first region.

One or more exemplary embodiment of the invention provides at least the following effects.

In the manufacturing device of an OLED display, an organic layer having a uniform thickness can be formed from the light-emitting material.

In addition, in the method for manufacturing the OLED display, a processing time can be reduced by substantially simultaneously performing discharging, drying and cooling of the light-emitting material.

BRIEF DESCRIPTION OF THE DRAWINGS

The above and other features and advantages of the invention will become more apparent by describing in detail embodiments thereof with reference to the attached drawings in which.

DETAILED DESCRIPTION

Figure 1:
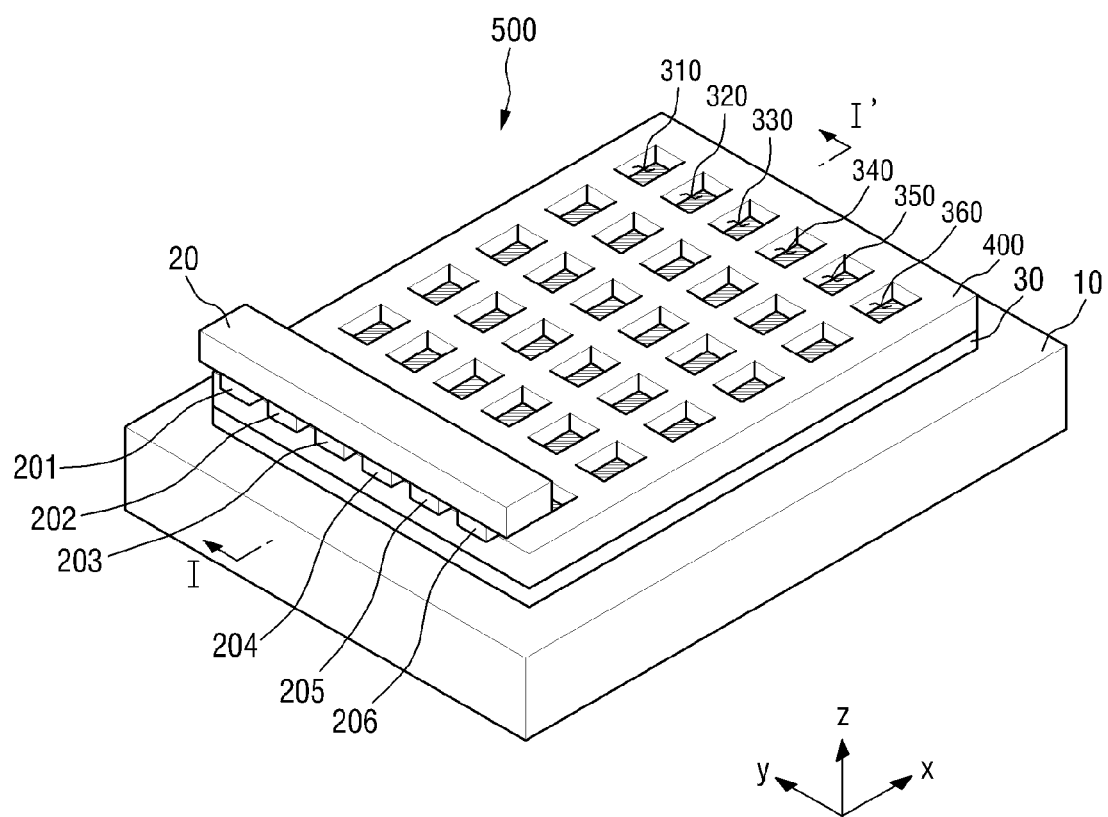
FIG. 1 is a perspective view of an exemplary embodiment of a manufacturing device of an organic light emitting diode ("OLED") display according to the invention.

The features of the invention and methods for achieving the features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the invention, the same drawing reference numerals are used for the same elements across various figures, and in the drawings, the size and relative sizes of layers and regions may be exaggerated for clarity. As used herein, the term "and/or" includes any and all combinations of one or more of the associated listed items.

Although the terms "first," "second," and so forth are used to describe diverse constituent elements, such constituent elements are not limited by the terms. The terms are used only to discriminate a constituent element from other constituent elements. Accordingly, in the following description, a first constituent element may be a second constituent element.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Where an organic light-emitting layer for an organic light emitting diode ("OLED") display is provided by ink jet printing, the organic light-emitting layer may be formed by discharging an organic light-emitting ink including an organic light-emitting material and a solvent, from an ink jet print head onto one or more pixels of a display region of a substrate, and drying the discharged organic light-emitting ink. Here, the organic light-emitting ink being dried may mean that the solvent included in the organic light-emitting ink is evaporated.

Since a solvent may be highly volatile, the solvent is rapidly volatilized after the organic light-emitting ink is discharged, so that the organic light-emitting ink may be dried. A concentration of the evaporated solvent molecules is relatively high at the center of the organic light-emitting ink discharged region and is relatively low at an edge of the organic light-emitting ink discharged region, that is, a boundary between the organic light-emitting ink discharged region and the organic light-emitting ink non-discharged region.

When a concentration gradient of the evaporated solvent molecules is non-uniform on the substrate, the evaporated solvent molecules are diffused from the center of the organic light-emitting ink discharged region to the edge of the organic light-emitting ink discharged region. In addition, the edge of the organic light-emitting ink discharged region is dried faster than the center of the organic light-emitting ink discharged region. Thus, the organic light-emitting layer of a pixel positioned at the edge of the organic light-emitting ink discharged region tends to be to structured to undesirably lean outwardly. That is to say, the organic light-emitting layer of the pixel positioned at the edge of the organic light-emitting ink discharged region may have non-uniform thicknesses, which may directly affect display quality of the OLED display.

The invention will now be described more fully hereinafter with reference to the accompanying drawings, in which exemplary embodiments of the invention are shown. FIG. 1 is a perspective view of an exemplary embodiment of a manufacturing device of an OLED display according to the invention and FIG. 2 is a cross-sectional view taken along line I-I' of FIG. 1.

Figure 2:
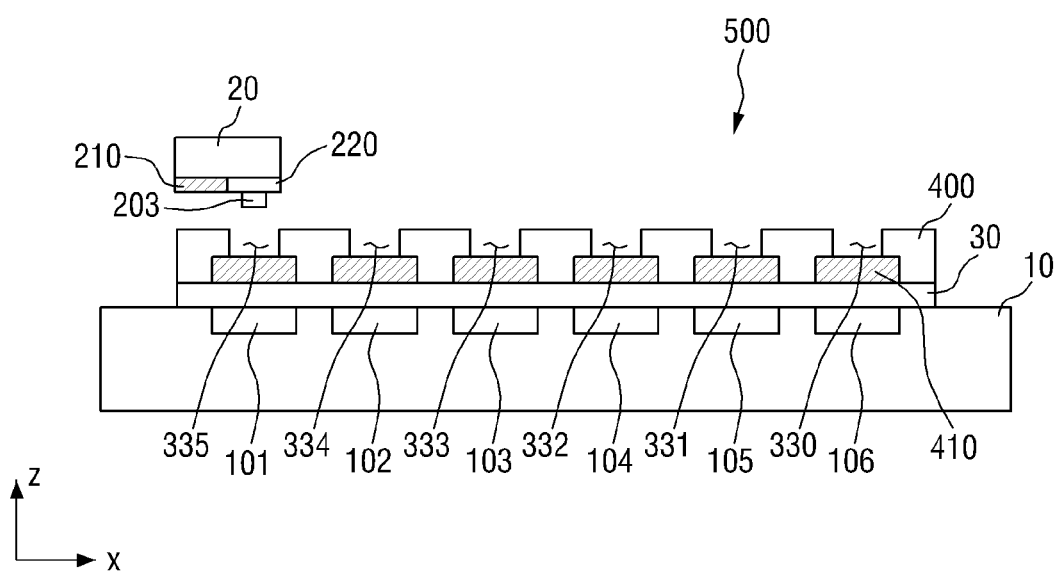
FIG. 2 is a cross-sectional view taken along line I-I' of FIG. 1.

Referring to FIGS. 1 and 2, the manufacturing device 500 of an OLED display includes a stage 10 including a temperature controller (not shown) for heating or cooling a substrate 30, a discharging unit such as a print head 20 including one or more nozzles 201 to 206 for discharging a material such as organic light-emitting ink onto the substrate 30, an irradiation unit 210 that irradiates beams or other energy onto the substrate 30, and a driving unit (not shown) that moves the stage 10 and/or the print head 20.

The stage 10 may support the substrate 30 and may include a relatively rigid material, but the material of the stage 10 is not limited thereto. In the illustrated embodiment, the stage 10 may be rectangular parallepipe-shaped, but the shape of the stage 10 is not limited thereto. The stage 10 may have a pair of opposing long sides and a pair of opposing short sides.

The stage 10 may include a temperature controller, and the temperature controller may include a plurality of temperature control regions. The temperature control regions may include a plurality of plurality of thermoelectric devices, and temperatures of the respective temperature control regions may be controlled independently, which will later be described.

The substrate 30 may be disposed on the stage 10. The substrate 30 may include a base substrate, a driving thin film transistor (not shown) and an insulating layer (not shown). The base substrate may include transparent glass, a plastic sheet or silicon, but the material of the base substrate is not limited thereto.

The substrate 30 may be one or more of a unit display substrate, or may be considered a mother board before being partitioned into a plurality of unit display substrates. The substrate 30 may be a single-layer sheet, or may include a plurality of sheet layers stacked one on another.

A switching thin film transistor (not shown) and a capacitor (not shown) as well as the driving thin film transistor (not shown) may be disposed on the substrate 30. The switching thin film transistor and/or the driving thin film transistor may include an active layer (not shown), gate electrode (not shown) disposed on or under the active layer to be parallel to the active layer, a gate insulating layer (not shown) disposed between the active layer and the gate electrode, and source/drain electrodes (not shown) electrically connected to opposite ends of the active layer.

An insulating layer of the substrate 30 is disposed on the driving thin film transistor. Via holes exposing a portion of the driving thin film transistor may be defined at various regions of the insulating layer. The insulating layer may include a layer of a photosensitive organic material, such as an acryl-based compound, and may be planarized to remove a step difference due to presence of underlying structures, such as thin film transistors.

An electrode 410 of the substrate 30 may be disposed on the insulating layer. The electrode 410 may be electrically connected to an output terminal of the driving thin film transistor through a via contact. The electrode 410 may be a positive electrode, which is a transparent electrode. Although not shown, a negative electrode may be disposed on a positive electrode to face the positive electrode.

In addition, a pixel defining layer 400 may be disposed on the substrate 30. The pixel defining layer 400 may define display regions including pixels 310, 320, 330, 340, 350 and 360, as suggested by the term. FIG. 1 illustrates that the pixels 310, 320, 330, 340, 350 and 360 have a rectangular planar shape, but the invention does not limit shapes of the pixels 310, 320, 330, 340, 350 and 360 to those illustrated herein.

The pixel defining layer 400 may include an insulating material, and may be provided (e.g., formed) through a mask patterning process, for example, a patterning process using a fine metal mask. In addition, a surface of the pixel defining layer 400 may be coated with a fluorine containing material, and/or the pixel defining layer 400 itself may include fluorine. Alternatively, after the pixel defining layer 400 is formed, the pixel defining layer 400 may also be subjected to plasma treatment. If the pixel defining layer 400 is treated with fluorine, surface energy of the pixel defining layer 400 is reduced, thereby reducing or effectively preventing foreign materials from being adsorbed into the surface of the pixel defining layer 400.

A plurality of pixels may be defined on the substrate 30. The plurality of pixels 310, 320, 330, 340, 350 and 360 may each be rectangular-shaped. The plurality of pixels 310, 320, 330, 340, 350 and 360 may be arrayed in an n×m matrix configuration ('n' and 'm' are integers of 1 or greater.). In the embodiment illustrated in FIG. 1, assuming that a row direction is referred to as a y-direction and a column direction is referred to as an x-direction, pixels may be arrayed on the substrate 30 in a 6×6 matrix configuration. However, the pixel array shown in FIG. 1 is provided only for illustration, and more or less pixels than those shown in FIG. 1 may be arrayed on the substrate 30. In addition, pixels may also be arrayed in a variety of shapes, such as a stripe shape or a pentile shape, in addition to the matrix configuration.

The print head 20 may be disposed on the stage 10, which will now be described in more detail with reference to FIG. 3.

Figure 3:
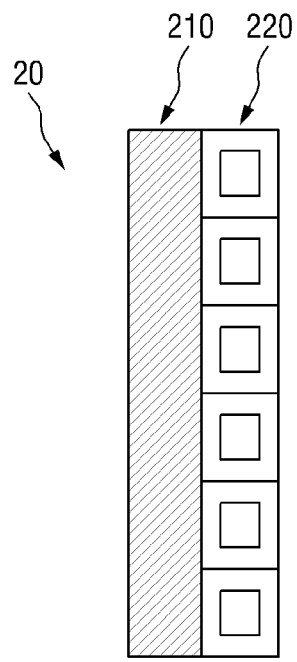
FIG. 3 is a plan view of an exemplary embodiment of a print head of the manufacturing device of an OLED display shown in FIG. 1, according to the invention.

FIG. 3 is a plan view of an exemplary embodiment of a print head of the manufacturing device of an OLED display shown in FIG. 1, according to the invention.

Referring to FIG. 3, the print head 20 of the manufacturing device 500 of the OLED display according to the invention may include a nozzle unit 220 in which a plurality of nozzles 201, 202, 203, 204, 205 and 206 are arranged, and the beam irradiation unit 210 disposed to contact one side of the nozzle unit 220 or to be adjacent to one side of the nozzle unit 220 and extending in a lengthwise direction of the print head 20.

The nozzle unit 220 may include a plurality of nozzles 201, 202, 203, 204, 205 and 206. The beam irradiation unit 210 irradiates energy beams, such as light or laser, onto the substrate 30. The plurality of nozzles 201, 202, 203, 204, 205 and 206 may be disposed in the nozzle unit 220. The nozzle unit 220 may lengthwise extend to be parallel to one side of the substrate 30 or may be rectangular parallelpipe-shaped, but the shape of the stage 10 is not limited thereto. The plurality of nozzles 201, 202, 203, 204, 205 and 206 may be disposed on a nozzle unit 220 surface facing a top surface of the substrate 30.

The plurality of nozzles 201, 202, 203, 204, 205 and 206 may be arrayed in a line in a lengthwise direction of the nozzle unit 220. In addition, the plurality of nozzles 201, 202, 203, 204, 205 and 206 may be arrayed in a plurality of rows and columns, that is, in a matrix configuration, but the arrangement of nozzles is not limited thereto. The plurality of nozzles 201, 202, 203, 204, 205 and 206 may be arrayed in various manners so as to correspond to configurations of pixels arranged on the substrate 30.

In the illustrated embodiment, the number of nozzles of the print head 20 may be equal to that of pixels defined in one row of the substrate 30. That is to say, in the substrate 30 having pixels arranged in a 6×6 matrix configuration, the print head 20 is aligned lengthwise and may include 6 nozzles 201, 202, 203, 204, 205 and 206 arranged in a line.

The nozzles 201, 202, 203, 204, 205 and 206 may discharge material such as organic light-emitting ink onto the substrate 30. The organic light-emitting ink 88 (refer to FIG. 6) may be a raw material for forming an organic light-emitting layer and may include an organic light-emitting material and a solvent. That is to say, the organic light-emitting ink 88 is dried on the substrate 30 and the organic light-emitting layer is formed when the solvent is completely evaporated.

In an exemplary embodiment, the organic light-emitting material may be a red organic light-emitting material, a green organic light-emitting material, or a blue organic light-emitting material. When a voltage is applied to the organic light-emitting material, red, green or blue light may be emitted. The solvent is used to dissolve the organic light-emitting material which is to be converted into a liquid. A material that is highly volatile and is well mixed with the organic light-emitting material may be used as the solvent. The organic light-emitting ink may be red ink including a red organic light-emitting material, green ink including a green organic light-emitting material, or blue ink including a blue organic light-emitting material. The red ink, the green ink and the blue ink are dried and the solvent is evaporated, thereby forming a red organic light-emitting layer, a green organic light-emitting layer, and a blue organic light-emitting layer.

The nozzles 201, 202, 203, 204, 205 and 206 may include at least one of red ink discharging nozzles, green ink discharging nozzles and blue ink discharging nozzles. In the illustrated embodiment, a set of the red ink discharging nozzles, the green ink discharging nozzle and the blue ink discharging nozzle may be defined, and the set of the red ink discharging nozzle, the green ink discharging nozzle and the blue ink discharging nozzle may be repeatedly arranged. In the embodiment illustrated in FIG. 3, two sets of red ink discharging nozzles 201 and 204, green ink discharging nozzles 202 and 205, and blue ink discharging nozzles 203 and 206 may be arranged in a line. The arrangement order and shape of the sets of red ink discharging nozzles, green ink discharging nozzles and blue ink discharging nozzles may vary in various manners.

The beam irradiation unit 210 may be disposed to be adjacent to or to contact one side of the nozzle unit 220 and may extend in a lengthwise direction of the print head 20. The beam irradiation unit 210 may irradiate beams onto the substrate 30. Detailed operations of the beam irradiation unit 210 will later be described.

The beam irradiation unit 210 may include one or more ultraviolet ("UV") lamps (not shown), and the beam irradiation unit 210 may irradiate UV rays, but the invention is not limited thereto. In another exemplary embodiment, the beam irradiation unit 210 may include one or more infrared ("IR") lamps, and the beam irradiation unit 210 may irradiate IR rays onto the substrate 30. Alternatively, the beam irradiation unit 210 may include an UV lamp and an IR lamp, and the beam irradiation unit 210 may UV rays and/or IR rays irradiate onto the substrate 30. Selection of the UV rays and/or IR rays may vary according to the kind of organic light-emitting ink 88 used.

The driving unit (not shown) may move the stage 10 and/or the print head 20. The operation of the stage 10 or the print head 20 moved by the driving unit will later be described in detail.

Figure 4:
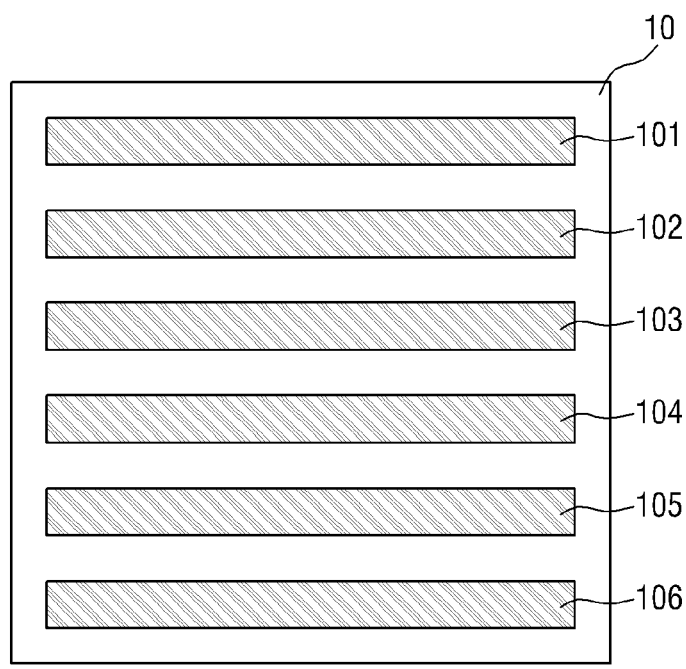
FIG. 4 is a plan view illustrating an exemplary embodiment of an arrangement of temperature control regions of the manufacturing device of an OLED display shown in FIG. 1, according to the invention.
Figure 4:
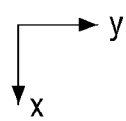

FIG. 4 is a plan view illustrating an exemplary embodiment of an arrangement of temperature control regions of the manufacturing device of an OLED display shown in FIG. 1 according to the invention.

Referring to FIG. 4, the manufacturing device 500 of the OLED display may include a plurality of temperature control regions 101, 102, 103, 104, 105 and 106 lengthwise extending in the row direction (e.g., in a y-direction of FIG. 1), arranged spaced a predetermined distance apart from each other in the x-direction and parallel with each other.

As described above, the stage 10 may include a temperature controller (not shown). The temperature controller may include a plurality of temperature control regions 101, 102, 103, 104, 105 and 106. In addition, temperatures of the respective temperature control regions 101, 102, 103, 104, 105 and 106 may be controlled independently. To this end, the temperature controller may include a controller that independently controls the temperatures of the respective temperature control regions 101, 102, 103, 104, 105 and 106. In the illustrated embodiment, the respective temperature control regions 101, 102, 103, 104, 105 and 106 have a rectangular planar shape, but the invention does not limit shapes of the temperature control regions 101, 102, 103, 104, 105 and 106 to that illustrated herein.

The respective temperature control regions 101, 102, 103, 104, 105 and 106 may include one or more of a plurality of plurality of thermoelectric devices, which will now be described in detail with reference to FIG. 5.

Figure 5:
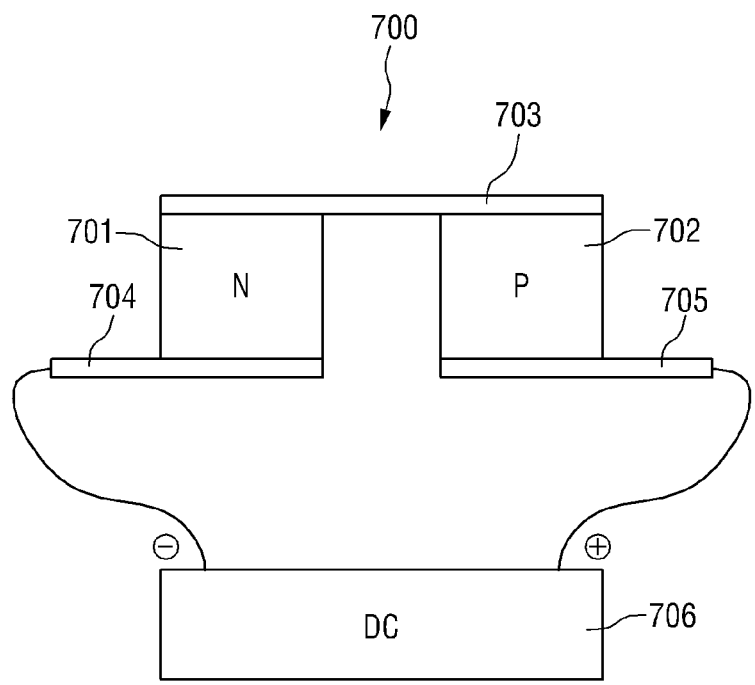
FIG. 5 is a schematic diagram illustrating an exemplary embodiment of a unit thermoelectric device according to the invention.

FIG. 5 is a schematic diagram illustrating an exemplary embodiment of a unit thermoelectric device according to the invention.

Referring to FIG. 5, the unit thermoelectric device 700 includes an N-type semiconductor 701, a P-type semiconductor 702, an upper conductor plate 703 coupled to upper portions of the N-type semiconductor 701 and the P-type semiconductor 702, a first lower conductor plate 704 coupled to a lower portion of the N-type semiconductor 701, and a second lower conductor plate 705 coupled to a lower portion of the P-type semiconductor 702.

In the aforementioned thermoelectric device 700, after a (−) power wire is connected to the first lower conductor plate 704 and a (+) power wire is connected to the second lower conductor plate 705, a power source 706 applies direct current ("DC") to the unit thermoelectric device 700. Accordingly, the first and second lower conductor plates 704 and 705 may be heated by a so-called Peltier effect, and the upper conductor plate 703 may be cooled. Conversely, if the directions of current flowing through the (−) power wire and the (+) power wire are switched, the first and second lower conductor plates 704 and 705 may be cooled, and the upper conductor plate 703 may be heated.

Based on the principle, the controller may independently control the plurality of temperature control regions. That is to say, the controller switches the directions of electrical current applied to the plurality of plurality of thermoelectric devices arranged in the temperature control regions, thereby heating or cooling top surfaces of the temperature control regions. In the following description, an exemplary embodiment where the top surfaces of the temperature control regions are heated is referred to as a heating mode, and a case where the top surfaces of the temperature control regions are cooled is referred to as a cooling mode.

Referring again to FIG. 4, the respective temperature control regions 101, 102, 103, 104, 105 and 106 may arranged to correspond to rows of pixels arranged on the substrate 30. FIG. 4 illustrates the arrangement of temperature control regions on the substrate 30, corresponding to that illustrated in FIG. 1. That is to say, where pixels are arranged on the substrate 30 in a 6×6 matrix configuration, one of the temperature control regions may be arranged to correspond to one row of the substrate 30, which is provided only for illustration. However, the arrangement type of the temperature control regions is not limited to that illustrated herein. That is to say, one temperature control region may be formed to correspond to one or more pixels arranged on the substrate 30. In addition, in terms of arrangement types, the temperature control regions may be arranged in various arrangement types.

Hereinafter, driving mechanism of the manufacturing device 500 of an OLED display will now be described.

Figure 6:
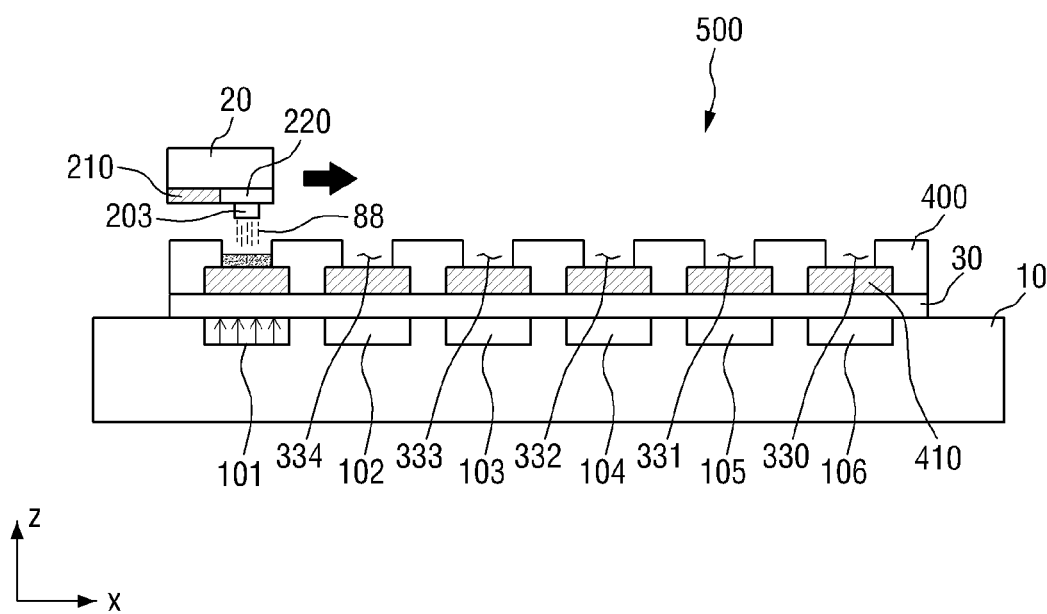
FIGS. 6 to 8 are cross-sectional views taken along line I-I' of FIG. 1 illustrating an exemplary embodiment of movement of the print head of the manufacturing device of an OLED display shown in FIG. 1, in a first direction.
Figure 7:
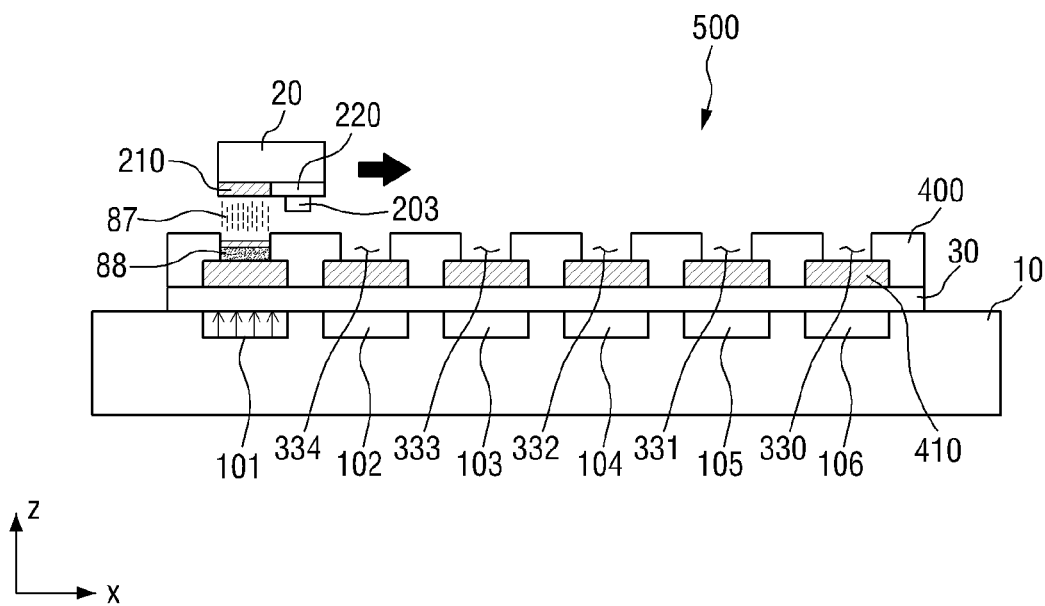
Figure 8:
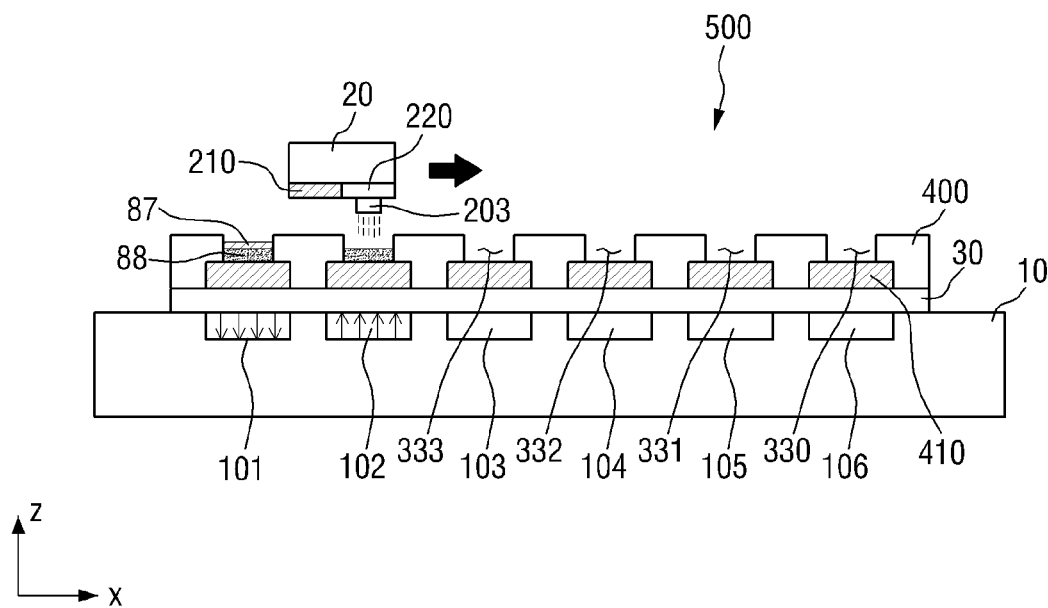

The driving mechanism of the manufacturing device 500 of an OLED display will be described in detail with reference to FIGS. 6 to 8. FIGS. 6 to 8 are cross-sectional views taken along line I-I' of FIG. 1 illustrating an exemplary embodiment of movement of the print head of the manufacturing device of an OLED display shown in FIG. 1, in a first direction.

Referring to FIG. 6, in the manufacturing device 500 of an OLED display, the print head 20 may move in a first direction, as indicated by the right-pointing arrow.

As described above, the print head 20 may be arranged to lengthwise extend to be parallel to one side of the substrate 30. In other words, the print head 20 may be arranged to extend in a row direction of pixels arranged on the substrate 30. In such a state, the print head 20 and the stage 10 opposed to and facing each other move linearly with respect to each other, in a predetermined direction.

Although not shown, a driving unit may move the print head 20 and/or the stage 10. The driving unit may include a motor and/or an actuator. For the sake of convenient explanation, the following description will be made with regard to an exemplary embodiment where the print head 20 moves the position of the stage 10 is fixed.

Where a lengthwise extension of the print head 20 perpendicular to a side of the substrate 30, the print head 20 may move in a direction perpendicular to the side of the substrate 30 (to be referred to as a first direction, hereinafter). That is to say, in FIG. 6, the first direction may be a positive x-axis direction. The print head 20 may move in a state where a position thereof is opposed to and faces the substrate 30. While moving, the print head 20 may be kept a predetermined distance from the substrate 30. In addition, the print head 20 may be translated at a constant speed linear motion, but the invention does not limit the movement speed of the print head 20 to that described herein. That is to say, the movement speed of the print head 20 may be controlled. In order to control the movement speed of the print head 20, the driving unit may further include a speed controlling device for controlling the movement speed of the print head 20.

While the print head 20 moves, the plurality of nozzles may discharge the organic light-emitting ink 88 toward the substrate 30. The nozzles 201, 202, 203, 204, 205 and 206 may continuously or intermittently discharge the organic light-emitting ink 88. That is to say, in the manufacturing device of the OLED display 500 according to the invention, not only a line printing method but a dot printing method may be employed. For the sake of convenient explanation, the following description will be made with regard to where the nozzles 201, 202, 203, 204, 205 and 206 intermittently discharge the organic light-emitting ink 88.

In addition, for the sake of convenient explanation, a plurality of temperature control regions will be referred to as first to sixth temperature control regions 101, 102, 103, 104, 105 and 106, and a plurality of pixels will be referred to as first to sixth pixel rows 335, 334, 333, 332, 331 and 330, in turn from the leftmost temperature control region or pixel in the cross-sectional views shown in FIGS. 6 to 8, respectively. In the cross-sectional views shown in FIGS. 6 to 8, the nozzle may refer to one or more nozzles of the plurality of nozzles 201, 202, 203, 204, 205 and 206 of the print head 20. Each of the pixel rows 335, 334, 333, 332, 331 and 330 may include the pixels 310, 320, 330, 340, 350 and 360.

As described above, the print head 20 may move from a first side to an opposing second side of the substrate 30. As the print head 20 moves along the first direction, the nozzles 201, 202, 203, 204, 205 and 206 of the print head 20 may be positioned on the first pixel row 335. If the nozzles 201, 202, 203, 204, 205 and 206 of the print head 20 are positioned on the first pixel row 335, the organic light-emitting ink 88 may be discharged by the nozzles 201, 202, 203, 204, 205 and 206 respectively toward the pixels 310, 320, 330, 340, 350 and 360 in the first pixel row 335 arranged on the substrate 30.

The first temperature control region 101 may be switched into a heating mode simultaneously or sequentially when the nozzles 201, 202, 203, 204, 205 and 206 discharge the organic light-emitting ink 88 toward the pixels 310, 320, 330, 340, 350 and 360 defined on the substrate 30. In FIGS. 6 to 8, arrows indicated upwardly in the temperature control regions may mean that the temperature control regions are in heating modes, and arrows indicated downwardly in the temperature control regions may mean that the temperature control regions are in cooling modes.

Where the first temperature control region 101 is heated simultaneously or sequentially when the nozzles 201, 202, 203, 204, 205 and 206 discharge the organic light-emitting ink 88 toward the pixels 310, 320, 330, 340, 350 and 360 defined in the first pixel row 335, impurities contained in the organic light-emitting ink 88 coated on the first pixel row 335 may be outgassed.

Referring to FIG. 7, as the print head 20 moves along the first direction, such as away from the first pixel row 335 and to be not overlapping the first pixel row 335, the beam irradiation unit 210 may be positioned on (e.g., overlapping) the first pixel row 335. If the beam irradiation unit 210 of the print head 20 is positioned on the first pixel row 335, may irradiate UV or IR rays toward the organic light-emitting ink 88 provided on the substrate 30. If the beam irradiation unit 210 irradiates UV or IR rays toward the organic light-emitting ink 88, a surface 87 of the organic light-emitting ink 88 may be provisionally hardened. If the surface 87 of the organic light-emitting ink 88 is provisionally hardened, movement of the surface 87 of the organic light-emitting ink 88 within the pixel defined by the pixel defining layer 400 can be reduced or effectively prevented, thereby improving layer uniformity of an organic light-emitting layer formed by the organic light-emitting ink 88.

In addition, while the beam irradiation unit 210 irradiates IR or UV rays toward the first pixel row 335, the first temperature control region 101 may heat the organic light-emitting ink 88 coated on the first pixel row 335.

Referring to FIG. 8, as the print head 20 progresses along the first direction, the nozzles 201, 202, 203, 204, 205 and 206 of the print head 20 may be positioned on the pixels 310, 320, 330, 340, 350 and 360 defined in the second pixel row 334. If the nozzles 201, 202, 203, 204, 205 and 206 of the print head 20 are positioned on the pixels 310, 320, 330, 340, 350 and 360 defined in the second pixel row 334, the nozzles 201, 202, 203, 204, 205 and 206 may respectively discharge the organic light-emitting ink 88 toward the pixels 310, 320, 330, 340, 350 and 360 defined in the second pixel row 334 on the substrate 30.

The second temperature control region 102 may be heated simultaneously or sequentially when the nozzles 201, 202, 203, 204, 205 and 206 discharge the organic light-emitting ink 88 toward the pixels 310, 320, 330, 340, 350 and 360 defined in the second pixel row 334. While the print head 20 moves progressively toward the opposing second side of the substrate 30 and does not overlap the first pixel row 335, the first temperature control region 101 may be switched to a cooling mode, as indicated by the downward arrows. In one exemplary embodiment, for example, when the second temperature control region 102 is in a heating mode, the first temperature control region 101 may be in a cooling mode, which is, however, provided only for illustration, and the invention does not limit the switching time of the first temperature control region 101 to the cooling mode to that listed herein.

As described above, if the temperature control regions 101, 102, 103, 104, 105 and 106 are switched to the cooling mode during a manufacturing process, a separate cooling step may be skipped after the coating of the organic light-emitting ink 88, thereby improving the efficiency of the overall process.

Similar to the view in FIG. 7, as the print head 20 moves progressively toward the opposing second side of the substrate 30, in the first direction, the beam irradiation unit 210 may be positioned on the pixels 310, 320, 330, 340, 350 and 360 defined in the second pixel row 334. If the beam irradiation unit 210 of the print head 20 is positioned on the pixels 310, 320, 330, 340, 350 and 360 defined in the second pixel row 334, the beam irradiation unit 210 may irradiate IR or UV rays toward the organic light-emitting ink 88 deposited in the pixels 310, 320, 330, 340, 350 and 360 defined on the substrate 30. If the beam irradiation unit 210 irradiates IR or UV rays toward the organic light-emitting ink 88, the surface 87 of the organic light-emitting ink 88 may be provisionally hardened.

The print head 20 may continue progression in the first direction towards a remainder of the pixel rows. That is to say, the print head 20 may reach the opposing second side of the substrate 30 via overlapping and then exposing the first to sixth pixel rows 335, 334, 333, 332, 331 and 330 while repeatedly performing the above-described operations. The movement of the print head 20 from the third pixel row 333 to the sixth pixel row 330 is substantially the same as the movement of the print head 20 from the first pixel row 335 to the second pixel row 334 shown in FIGS. 6-8, and repeated explanations thereof will be omitted.

Hereinafter, other exemplary embodiments of the invention will be described. In the following exemplary embodiments, the same functional components as those of the previous exemplary embodiments will be designated by the same reference numerals, and repeated descriptions will be omitted or briefly given.

Figure 9:
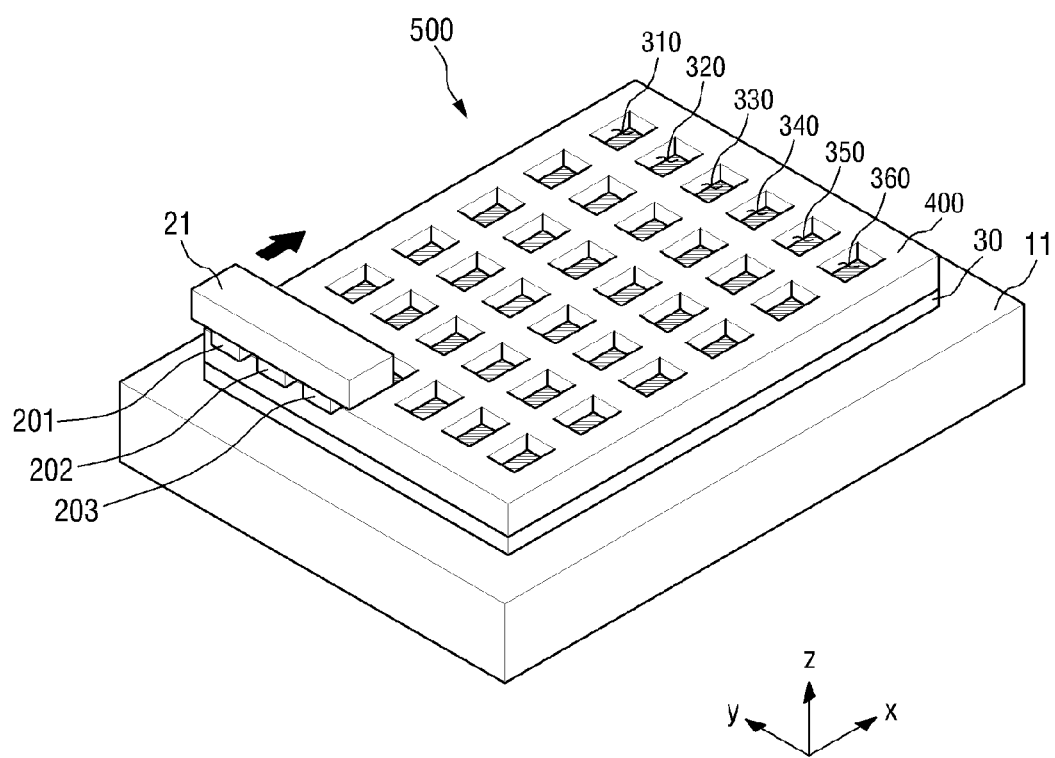
FIG. 9 is a perspective view of another exemplary embodiment of a manufacturing device of an OLED display according to the invention.
Figure 10:
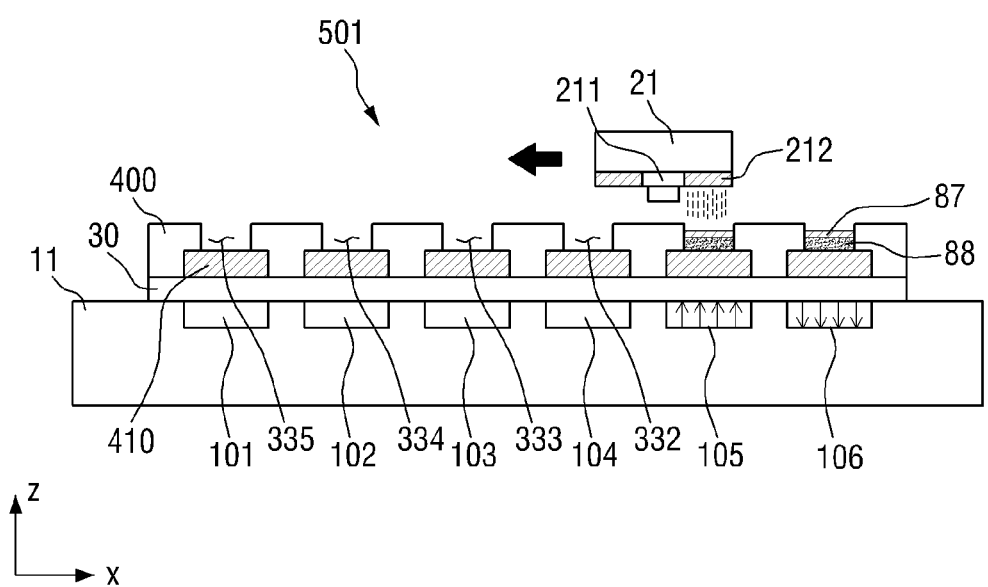
FIG. 10 is a cross-sectional view of the manufacturing device of the OLED display shown in FIG. 9.

FIG. 9 is a perspective view of another exemplary embodiment of a manufacturing device of an OLED display according to the invention and FIG. 10 is a cross-sectional view of the manufacturing device 501 of an OLED display shown in FIG. 9.

Referring to FIGS. 9 and 10, the manufacturing device of an OLED display 501 is different from that of the previous exemplary embodiment shown in FIG. 1 in that a print head 21 includes only three nozzles 201, 202 and 203.

The number of nozzles of the print head 21 may be smaller than that of pixels arranged on one row of the substrate 30. Since the number of nozzles is smaller than the number of pixels in a pixel row, the print head 21 may move between the first pixel row to the last pixel row defined on the substrate 30 repeatedly a number of times instead of only once.

In more detail, the print head 21 may move from a first side of the substrate 30 at the first pixel row 335, in a first direction (e.g., positive x-direction), to reach an opposing second side of the substrate 30 at the last pixel row, e.g., 330. The way in which the print head 21 moves from the first side of the substrate 30 to reach the opposing second side of the substrate 30 may be substantially the same as the way described above with reference to FIGS. 6 to 8, except that arrangement of temperature control regions is different from that shown in FIG. 4, which will later be described.

The print head 21 having reached the opposing second side of the substrate 30 at the last pixel row 330, may move in a substantially linear path in a second direction different from the first direction. The second direction may be perpendicular to the first direction, which may be a positive or a negative y-axis direction with reference to in FIG. 9 and depending upon from which pixels the print head 21 starts.

The print head 21 having moved a predetermined distance in the second direction may move in a third direction different from the second direction. The third direction may be perpendicular to the second direction, which may be a negative x-axis direction illustrated in FIG. 10. That is to say, in a first pass of the substrate 30 for first group of pixels, the print head 21 moves from the first side of the substrate 30 at the first pixel row 335, in the first direction, to reach the opposing second side of the substrate 30 at the last pixel row 330. After having reached the opposing second side of the substrate 30, the print head 21 may further move a predetermined distance along the opposing second side of the substrate 30 in the second direction to be repositioned at a second group of pixels different from and/or adjacent to the first group of pixels. The print head 21 may then further move from the opposing second side of the substrate to the first side of the substrate 30 at the first pixel row 335.

As described above, more pixels than those shown in FIGS. 9 and 10 may be defined on the substrate 30. When more pixels than those shown in FIGS. 9 and 10 are defined on the substrate 30, the print head 21 may repeatedly perform the above-described operations one or more times. That is to say, the print head 21 may coat the organic light-emitting ink 88 on an entire region of the substrate 30 on which pixels are arranged by repeatedly moving in the first direction, the second direction, the third direction and the second direction, sequentially in that order. In other words, the print head 21 may move on the substrate 30 in one direction selected from the group consisting of the first direction, the second direction and the third direction.

Figure 11:
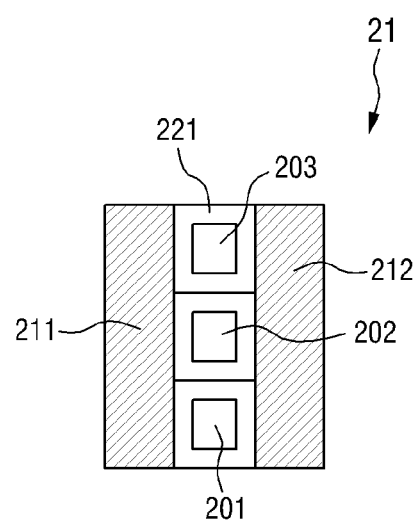
FIG. 11 is a plan view of an exemplary embodiment of a print head of the manufacturing device of the OLED display shown in FIG. 9, according to the invention.

FIG. 11 is a plan view of an exemplary embodiment of a print head of the manufacturing device of an OLED display shown in FIG. 9.

Referring to FIG. 11, in the manufacturing device 501 of the OLED display, the print head 21 is different from that of the previous exemplary embodiment in that it includes a nozzle unit 221 and beam irradiation units 211 and 212. The nozzle unit 221 includes a plurality of nozzles 201, 202 and 203 arranged so as to contact or to be adjacent to both of opposing sides of the nozzle unit 221, and the beam irradiation units 211 and 212 lengthwise extend in a lengthwise direction of the print head 21.

Figure 12:
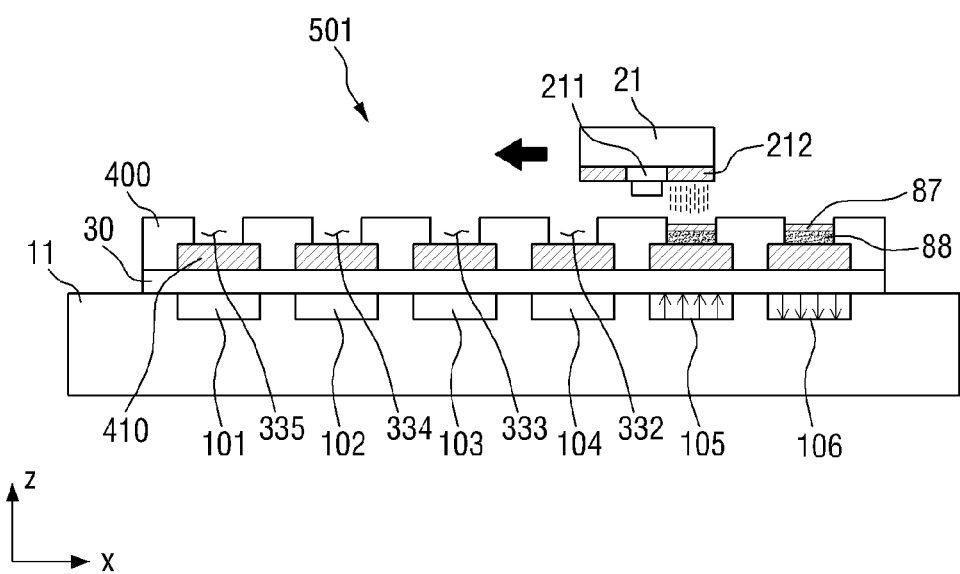
FIG. 12 is a cross-sectional view illustrating an exemplary embodiment of movement of the print head of the manufacturing device of the an OLED display shown in FIG. 9, in a third direction.

Referring to FIG. 12, the manufacturing device of an OLED display 501 is different from that of the previous exemplary embodiment shown in FIG. 1 in that when a print head 21 moves in a third direction, a second beam irradiation unit 212 irradiates beams onto a substrate 30.

As described above, after nozzles 201, 202 and 203 discharge organic light-emitting ink 88 into pixels, the beam irradiation unit 212 may irradiate UV or IR rays into the pixels.

In the manufacturing device of an OLED display according to the illustrated exemplary embodiment of the invention, one of two beam irradiation units 211 and 212 is selected according to the moving direction of the print head 21 to irradiate UV or IR rays on a surface of the organic light-emitting ink 88. That is to say, if the print head 21 moves in the first direction, after the nozzles 201, 202 and 203 discharge the organic light-emitting ink 88, the first beam irradiation unit 211 may irradiate UV or IR rays on the pixels. If the print head 21 moves in the third direction, after the nozzles 201, 202 and 203 discharge the organic light-emitting ink 88, the second beam irradiation unit 212 may irradiate UV or IR rays on the pixels.

Figure 13:
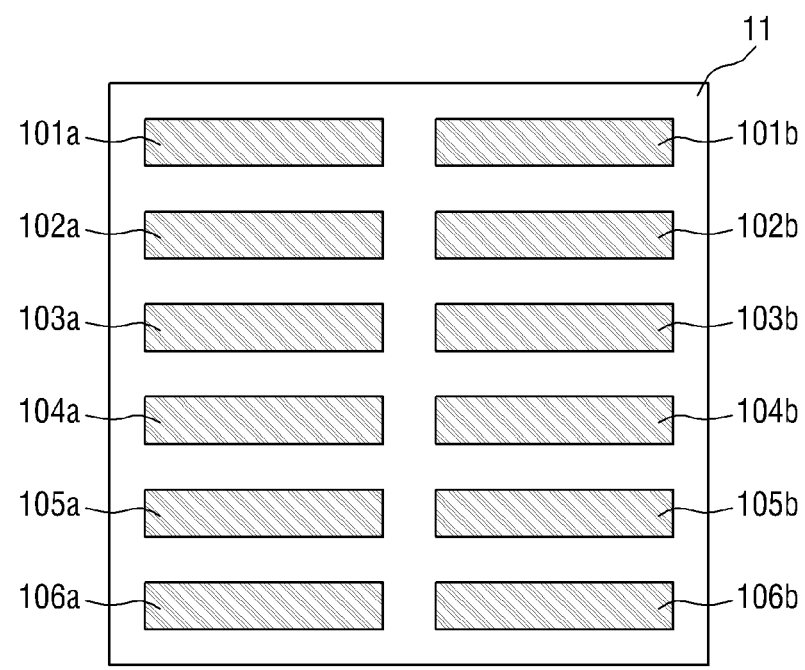
FIG. 13 is a plan view illustrating an exemplary embodiment of an arrangement of temperature control regions of the manufacturing device of the OLED display shown in FIG. 9, according to the invention.
Figure 13:
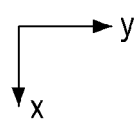

FIG. 13 is a plan view illustrating an exemplary embodiment of an arrangement of temperature control regions of the manufacturing device of an OLED display shown in FIG. 9, according to the invention.

Referring to FIG. 13, the manufacturing device of an OLED display shown in FIG. 13 according to the invention is different from the manufacturing device of an OLED shown in FIG. 4 in that temperature control regions are arranged in a 2×6 matrix configuration.

As described above, one of the temperature control regions may be arranged to correspond to one or more pixels. In the illustrated exemplary embodiment, each one temperature control region defined on stage 11 may be arranged to correspond to groups of pixels. The arrangement of the temperature control regions shown in FIG. 13 may also be employed to the manufacturing device of an OLED display shown in FIG. 10. Referring to FIGS. 10 and 12, the temperature control region 101 may include two temperature control sub-regions 101a and 101b. Sub-region 101a may correspond to pixels 340, 350 and 360, while sub-region 101b may correspond to pixels 310, 320 and 330, in respective pixel rows. The same may be said for temperature control regions 105 through 101.

That is to say, if the print head 21 coats organic light-emitting ink 88 onto a group of three pixels defined on the substrate 30 while moving in the first direction, temperature control regions 101a, 102a, 103a, 104a, 105a and 106a may respectively heat or cool the group of three pixels coated with the organic light-emitting ink 88 simultaneously or sequentially when the print head 21 moves. Here, for the sake of convenient explanation, the row of temperature control sub-regions in the left of FIG. 13 is referred to as the first row of temperature control regions, and the row in the right of FIG. 13 is referred to as a second row of temperature control regions. In addition, if the print head 21 having reached the opposing second side of the substrate 30 coats the organic light-emitting ink 88 onto the substrate 30 while moving toward the first side of the substrate 30 in a third direction (e.g., negative x-direction), temperature control regions 101b, 102b, 103b, 104b, 105b and 106b arranged on the second row may heat or cool regions coated with the organic light-emitting ink 88 simultaneously or sequentially when the print head 21 moves. The way and sequence in which the temperature control regions heat or cool the organic light-emitting ink 88 may be substantially the same as the way and order described above with reference to FIGS. 6 to 8, and detailed descriptions thereof will be omitted.

Figure 14:
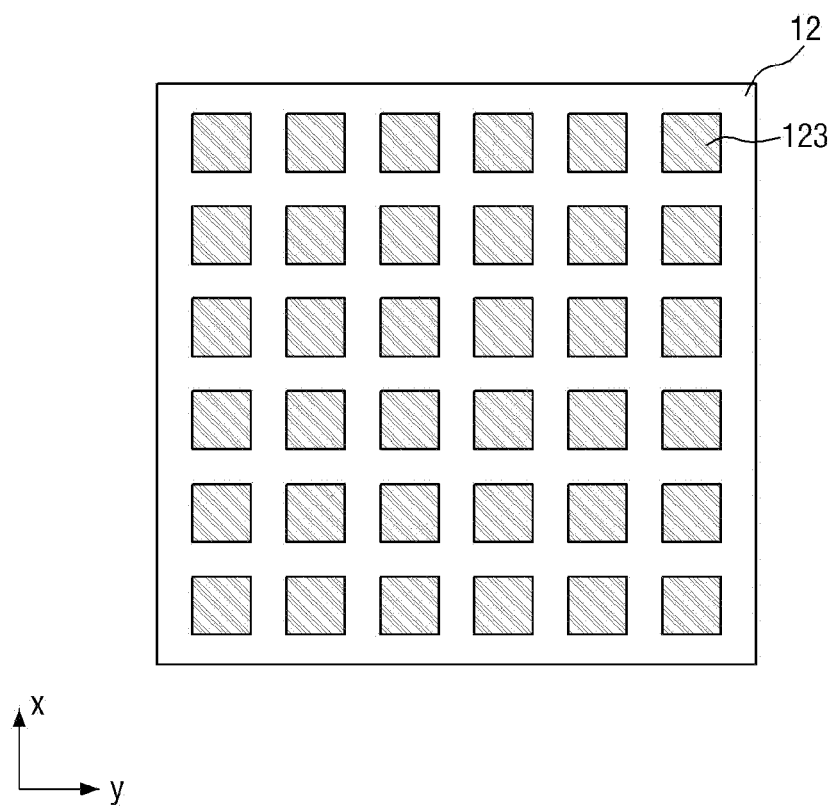
FIG. 14 is a plan view illustrating another exemplary embodiment of an arrangement of temperature control regions of a manufacturing device of an OLED display according to the invention.

FIG. 14 is a plan view illustrating another exemplary embodiment of an arrangement of temperature control regions of a manufacturing device of an OLED display according to the invention.

Referring to FIG. 14, the manufacturing device of an OLED display according to the invention is different from the manufacturing device of the OLED display shown in FIG. 4 in that temperature control regions are arranged in a 6×6 matrix configuration. That is, the temperature control regions defined on stage 12 are in one-to-one correspondence with the pixel regions defined on the substrate 30.

As described above, a plurality of temperature control regions may be defined to respectively correspond to only one pixel. That is to say, one temperature control region 123 may heat or cool only one pixel. FIG. 14 illustrates an arrangement type of the temperature control region 123 corresponding to the substrate 30 shown in FIG. 1. That is to say, FIG. 14 illustrates temperature control regions 123 are arranged in a 6×6 matrix configuration, but the invention does not limit the arrangement type of the temperature control regions to that illustrated herein.

Where the temperature control region 123 is defined to correspond to only one pixel, if the print head, including a plurality of nozzles 201, 202 and 203 and having various shapes, coats organic light-emitting ink 88, regions coated with the organic light-emitting ink 88 may be heated or cooled by the temperature control regions 123 accordingly.

Hereinafter, an exemplary embodiment of a method for manufacturing the OLED display according to the invention will be described. The OLED display manufacturing method may be implemented by using one or more exemplary embodiment of the manufacturing device of the OLED display according to the invention. For the sake of convenient explanation, the same functional components as those of the embodiment shown in FIGS. 1 to 8 will be designated by the same reference numerals, and repeated descriptions will be omitted.

An exemplary embodiment of an OLED display manufacturing method according to the invention may include arranging a substrate 30 on a stage 10, sequentially discharging (e.g., providing) organic light-emitting ink 88 onto pixel regions defined on the substrate 30 in a first direction, heating regions coated with the organic light-emitting ink 88 simultaneously or sequentially when the organic light-emitting ink 88 is discharged onto the substrate 30, and hardening a surface of the organic light-emitting ink 88 by irradiating beams onto the organic light-emitting ink 88.

The substrate 30 may be disposed on the stage 10. The substrate 30 and the stage 10 are substantially the same as those shown in FIG. 1, and detailed descriptions thereof will be omitted.

With the substrate 30 disposed on the stage 10, the organic light-emitting ink 88 may be sequentially discharged (e.g., provided) onto pixel regions defined on the substrate 30 in the first direction. The discharging of the organic light-emitting ink 88 may be performed by a print head including a plurality of nozzles 201, 202 and 203, but the invention is not limited thereto. The print head may be substantially the same as that of one or more exemplary embodiment of the manufacturing device of an OLED display according to the invention.

In the organic light-emitting ink 88 is discharged, the regions of the substrate 30 coated with the organic light-emitting ink 88 may be heated simultaneously or sequentially when the organic light-emitting ink 88 is coated. The heating of the organic light-emitting ink 88 may be implemented by the temperature controller described above with regard to one or more exemplary embodiment of the manufacturing device of an OLED display according to the invention.

The hardening of the organic light-emitting ink 88 by irradiating beams onto the coated organic light-emitting ink 88 may include irradiating UV or IR rays into a surface of the organic light-emitting ink 88. If the UV or IR rays are irradiated into the surface of the organic light-emitting ink 88, the surface of the organic light-emitting ink 88 may be provisionally hardened, which is the same as described above.

The exemplary embodiment of the OLED display manufacturing method according to the invention may further include cooling the regions of the substrate 30 coated with the organic light-emitting ink 88, after the hardening of the surface of the organic light-emitting ink 88 by irradiating the UV or IR rays into the surface of the organic light-emitting ink 88.

As described above with regard to one or more exemplary embodiments of the invention, the heating or cooling of the organic light-emitting ink 88 may be performed by a temperature controller including a plurality of thermoelectric devices.

The temperature controller switches the direction of current applied to the plurality of plurality of thermoelectric devices, thereby heating or cooling the organic light-emitting ink 88.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the exemplary embodiments be considered in all respects as illustrative and not restrictive, reference being made to the appended claims rather than the foregoing description to indicate the scope of the invention.

What is claimed is:

1. A method for manufacturing an organic light emitting diode display, the method comprising:
    providing a substrate comprising a plurality of regions arranged in a first direction, on a stage;
    sequentially providing light-emitting material to the plurality of regions of the substrate, in the first direction;
    heating a first region having the light-emitting material therein, among the plurality of regions, by a temperature controller, at substantially a same time or after the light-emitting material is provided to the first region; and
    hardening a surface of the light-emitting material in the first region, by irradiating a beam to the light-emitting material in the first region.

2. The method of claim 1, wherein after the hardening a surface of the light-emitting material, further comprising cooling the first region having the light-emitting material therein.

3. The method of claim 2, wherein
    the temperature controller comprises a plurality of plurality of thermoelectric devices, and
    the cooling the first region comprises switching a direction of electrical current applied to a plurality of thermoelectric devices.

* * * * *